(12) United States Patent
Lv et al.

(10) Patent No.: US 10,079,448 B2
(45) Date of Patent: Sep. 18, 2018

(54) CABLE CONNECTOR ASSEMBLY HAVING SEIZING STRUCTURE AND METHOD OF MAKING THE SAME

(71) Applicant: FOXCONN INTERCONNECT TECHNOLOGY LIMITED, Grand Cayman (KY)

(72) Inventors: Wen-Feng Lv, Kunshan (CN); Dou-Feng Wu, Kunshan (CN); Xiao-Li Li, Kunshan (CN); Chien-Hsun Huang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/230,649

(22) Filed: Aug. 8, 2016

(65) Prior Publication Data

US 2017/0040740 A1 Feb. 9, 2017

(30) Foreign Application Priority Data

Aug. 6, 2015 (CN) .......................... 2015 1 0476074

(51) Int. Cl.
*H01R 13/58* (2006.01)
*H01R 43/033* (2006.01)
*H05K 9/00* (2006.01)

(52) U.S. Cl.
CPC ....... *H01R 13/5845* (2013.01); *H01R 43/033* (2013.01); *H05K 9/0098* (2013.01)

(58) Field of Classification Search
CPC . H01R 13/5845; H01R 43/033; H05K 9/0098
USPC .................................................. 439/448, 502
See application file for complete search history.

(56) References Cited

U.S. PATENT DOCUMENTS

| 1,946,190 | A | * | 2/1934 | Brodhun | ............... | H01B 7/226 |
| | | | | | | 174/105 R |
| 2,133,863 | A | * | 10/1938 | Knoderer | ............... | H01B 7/226 |
| | | | | | | 174/10 |
| 3,621,118 | A | * | 11/1971 | Steve Bunish | .......... | H01B 7/08 |
| | | | | | | 174/115 |
| 3,927,247 | A | * | 12/1975 | Timmons | ........... | H01B 11/1808 |
| | | | | | | 174/107 |
| 4,002,820 | A | * | 1/1977 | Paniri | .................... | H01B 7/182 |
| | | | | | | 174/106 SC |
| 4,131,757 | A | * | 12/1978 | Felkel | ..................... | H01B 7/04 |
| | | | | | | 138/130 |
| 4,313,029 | A | * | 1/1982 | Bunish | .................. | H01B 9/028 |
| | | | | | | 174/106 SC |

(Continued)

FOREIGN PATENT DOCUMENTS

CN 202917194 U 5/2013
CN 203826663 U 9/2014

*Primary Examiner* — Tulsidas C Patel
*Assistant Examiner* — Travis Chambers
(74) *Attorney, Agent, or Firm* — Wei Te Chung; Ming Chieh Chang

(57) ABSTRACT

A cable connector assembly includes a first connector having a mating portion and a rear portion; a cable connected with the first connector; and a seizing structure bundling the cable. The seizing structure includes a metal wire wrapping the cable, a middle insulative layer cladding the metal wire, and an outer insulative layer wrapping the middle insulative layer.

17 Claims, 7 Drawing Sheets

(56) References Cited

U.S. PATENT DOCUMENTS

| | | | | |
|---|---|---|---|---|
| 4,719,319 A * | 1/1988 | Tighe, Jr. | H01B 7/0823 | 174/103 |
| 4,730,088 A * | 3/1988 | Suzuki | H01B 7/0233 | 174/102 R |
| 4,773,879 A * | 9/1988 | Pauza | H01R 9/034 | 174/88 C |
| 4,801,764 A * | 1/1989 | Ohlhaber | H01B 7/08 | 174/117 F |
| 5,171,938 A * | 12/1992 | Katsumata | H01B 7/08 | 174/105 SC |
| 5,212,350 A * | 5/1993 | Gebs | H01B 11/1808 | 156/50 |
| 5,930,100 A * | 7/1999 | Gasque, Jr. | H01B 11/1091 | 174/108 |
| 6,283,789 B1 * | 9/2001 | Tsai | H01R 27/02 | 439/502 |
| 7,034,228 B2 * | 4/2006 | Yokoi | H01B 11/183 | 174/102 R |
| 7,314,998 B2 * | 1/2008 | Amato | H01B 11/1895 | 174/84 R |
| 7,705,241 B2 * | 4/2010 | Steward, Jr. | H01B 7/226 | 174/102 R |
| 2005/0199411 A1 * | 9/2005 | Doll | H01T 13/04 | 174/86 |
| 2008/0250632 A1 | 10/2008 | Dayton et al. | | |
| 2011/0021069 A1 * | 1/2011 | Hu | H01B 11/203 | 439/578 |
| 2011/0070769 A1 * | 3/2011 | Lin | H01B 7/40 | 439/502 |
| 2013/0244476 A1 * | 9/2013 | Symons | H01R 13/60 | 439/502 |

* cited by examiner

CABLE CONNECTOR ASSEMBLY HAVING SEIZING STRUCTURE AND METHOD OF MAKING THE SAME

BACKGROUND OF THE INVENTION

1. Field of the Invention

The present invention relates generally to a cable connector assembly, and more particularly to a cable connector assembly having a seizing structure.

2. Description of Related Arts

China Patent No. CN204088825U, issued on Jan. 1, 2015, discloses a cable connector assembly comprising a first connector, a second connector, and a cable connecting the first connector and the second connector. The cable comprises a core wire and a seizing structure bundling the wire. The seizing structure comprises a metal wire and an insulative layer wrapping the metal wire.

An improved cable connector assembly is desired.

SUMMARY OF THE INVENTION

An object of the present invention is to provide a cable connector assembly having an improved seizing structure.

To achieve the above-mentioned object, a cable connector assembly includes a first connector having a mating portion and a rear portion; a cable connected with the first connector; and a seizing structure bundling the cable. The seizing structure includes a metal wire wrapping the cable, a middle insulative layer cladding the metal wire and an outer insulative layer wrapping the middle insulative layer.

Other objects, advantages and novel features of the invention will become more apparent from the following detailed description when taken in conjunction with the accompanying drawings.

DETAILED DESCRIPTION OF THE PREFERRED EMBODIMENT

Figure 1:
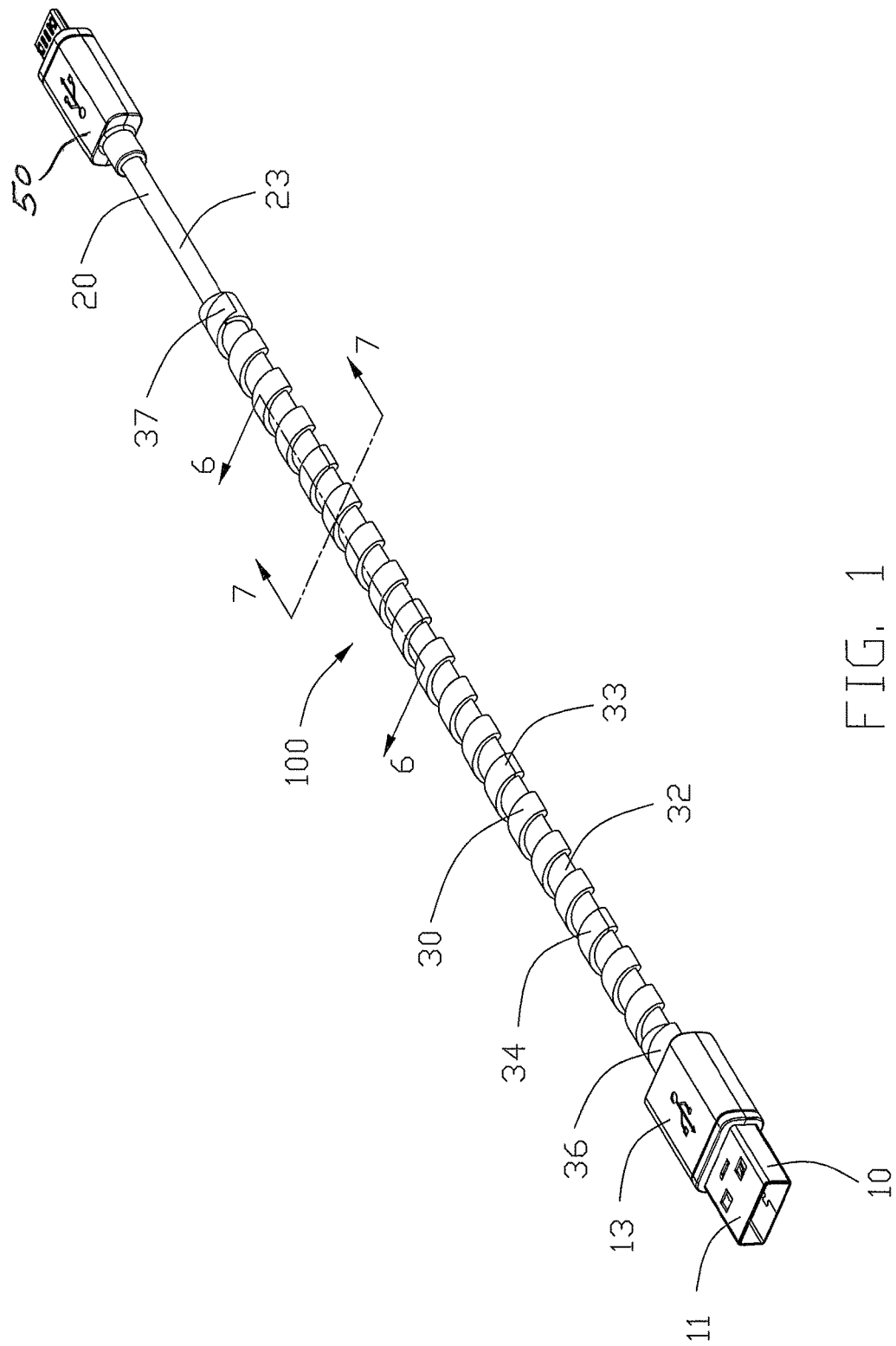
FIG. 1 is a perspective, assembled view of a cable connector assembly in accordance with the present invention.
Figure 2:
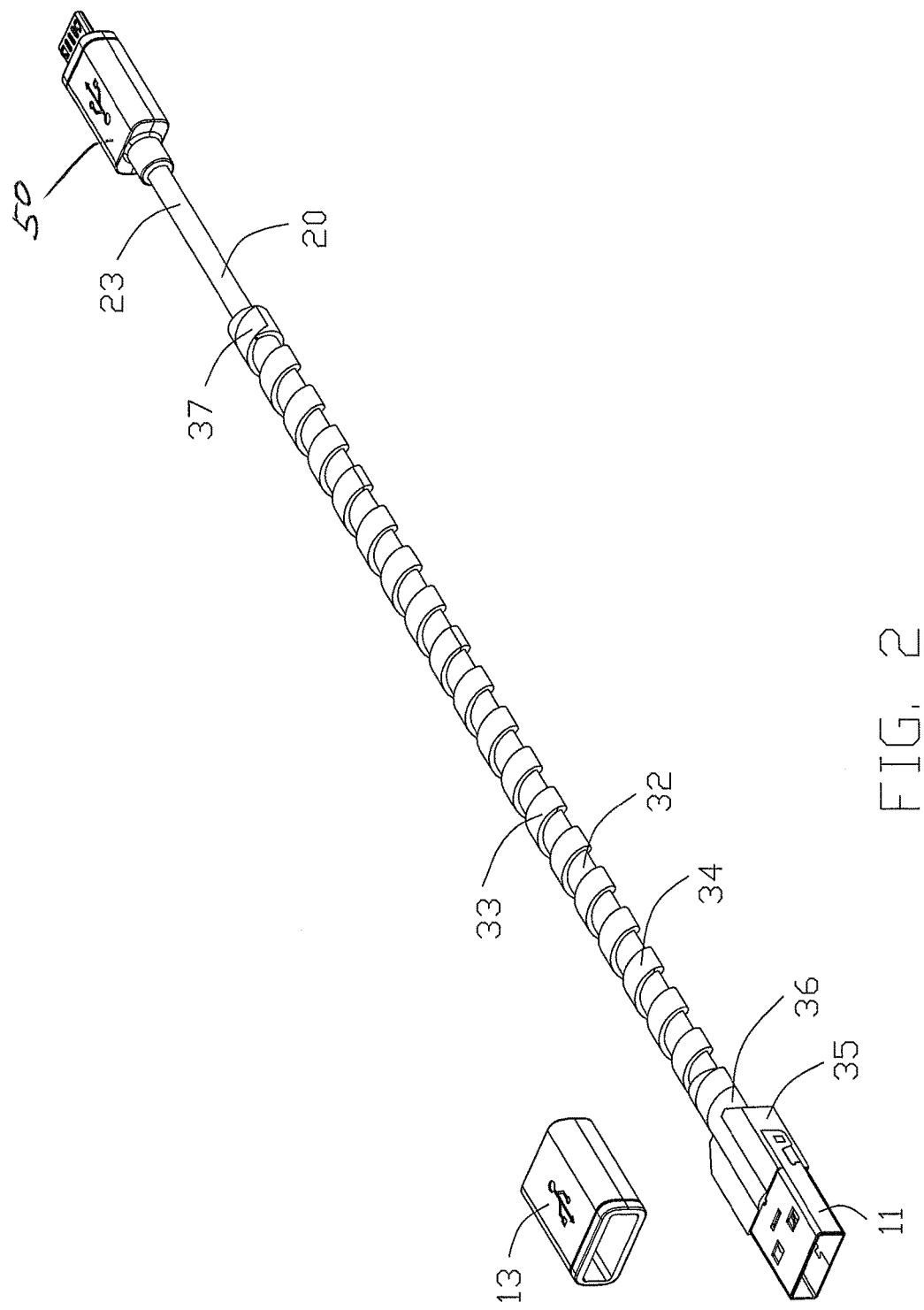
FIG. 2 is a perspective, partially exploded view of the cable connector assembly shown in FIG. 1.
Figure 3:
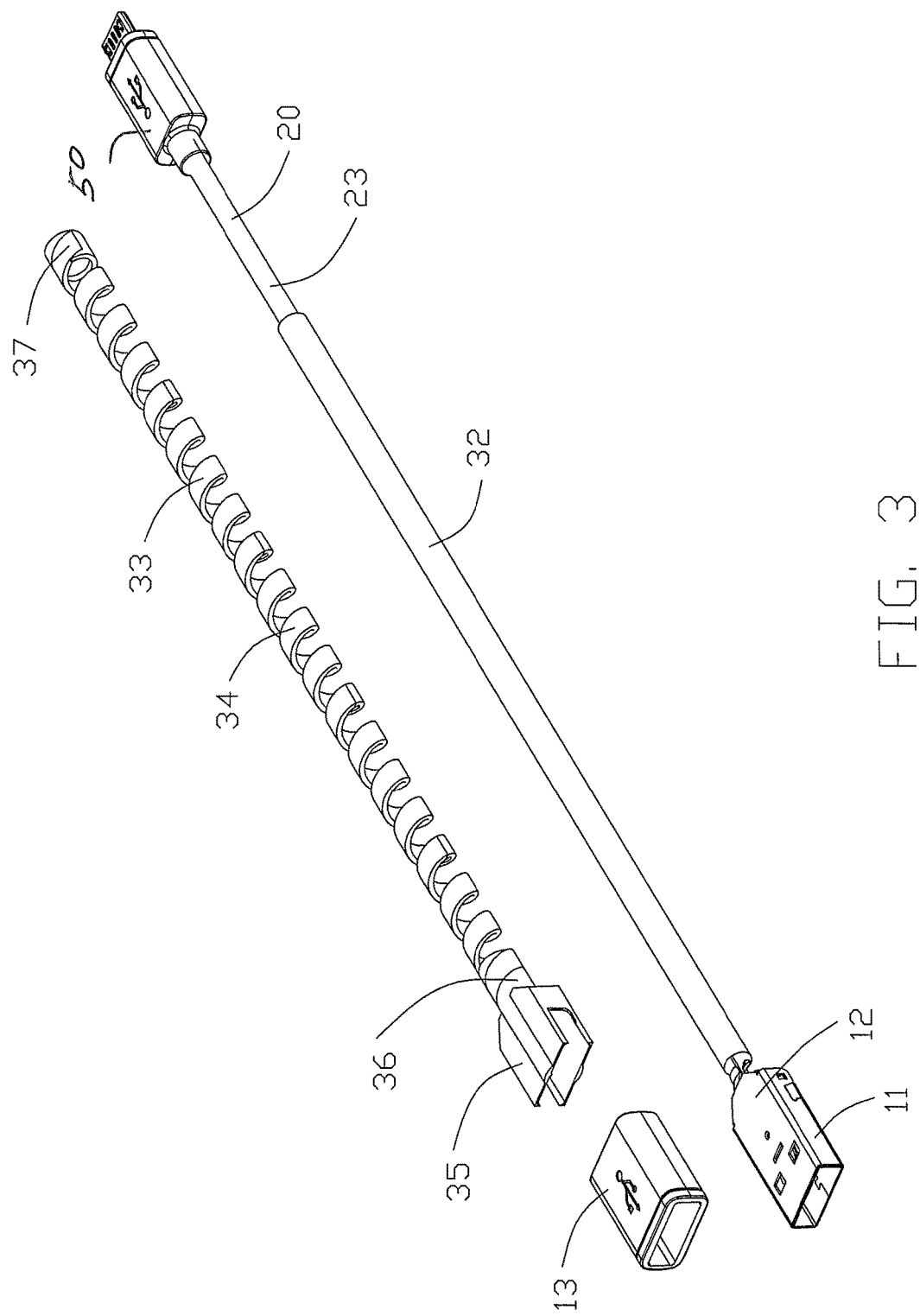
FIG. 3 is a further partially exploded view of the cable connector assembly shown in FIG. 2.
Figure 4:
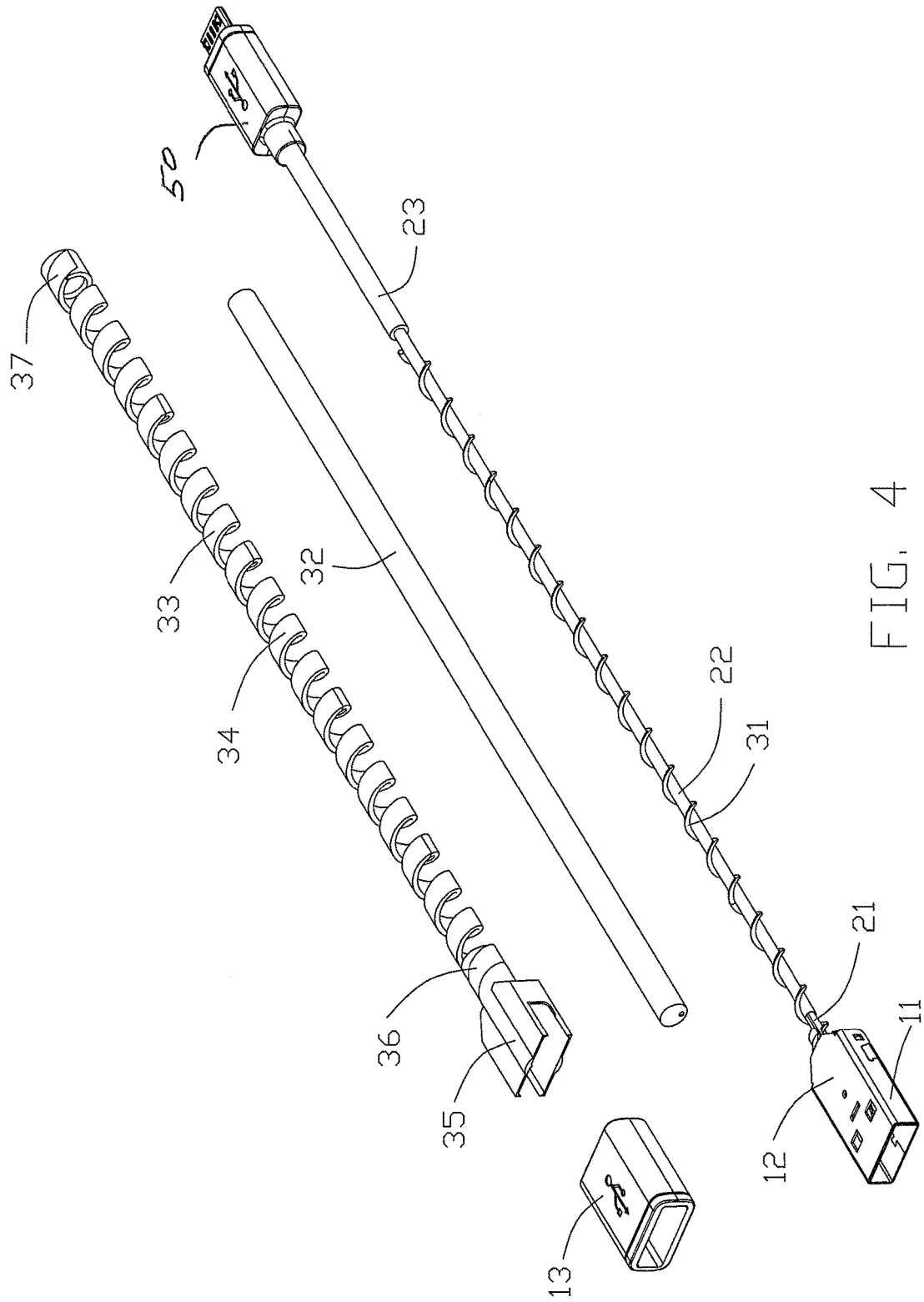
FIG. 4 is a further partially exploded view of the cable connector assembly shown in FIG. 3.
Figure 5:
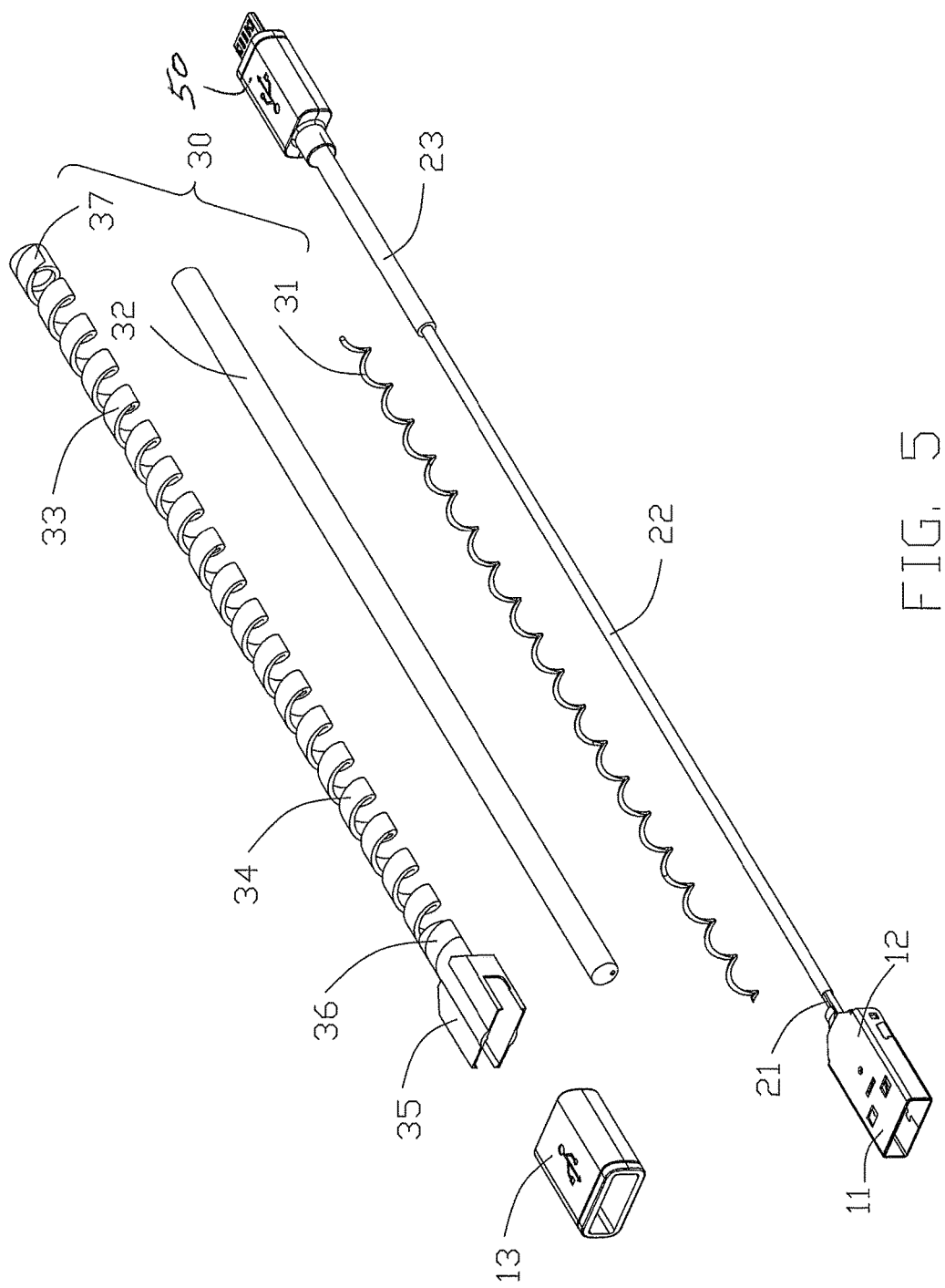
FIG. 5 is a further partially exploded view of the cable connector assembly shown in FIG. 4.
Figure 6:
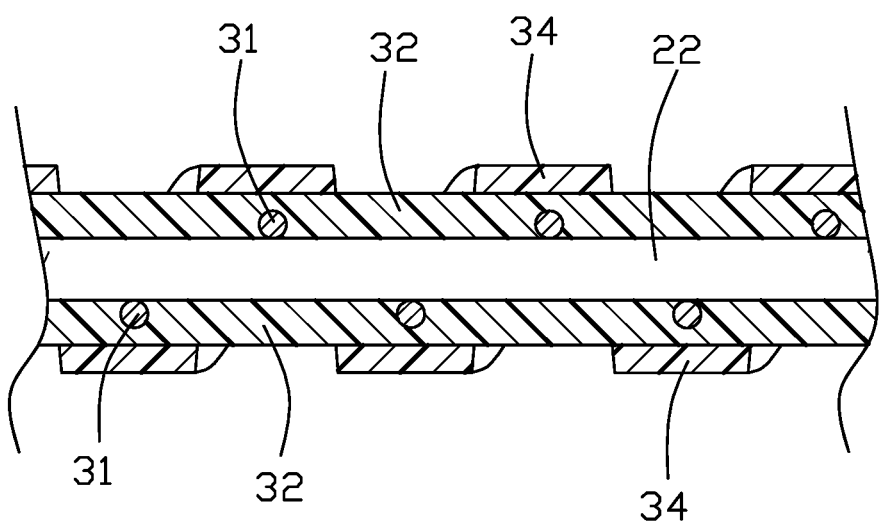
FIG. 6 is a cross-sectional view of the cable connector assembly shown in FIG. 1 along line 6-6.
Figure 7:
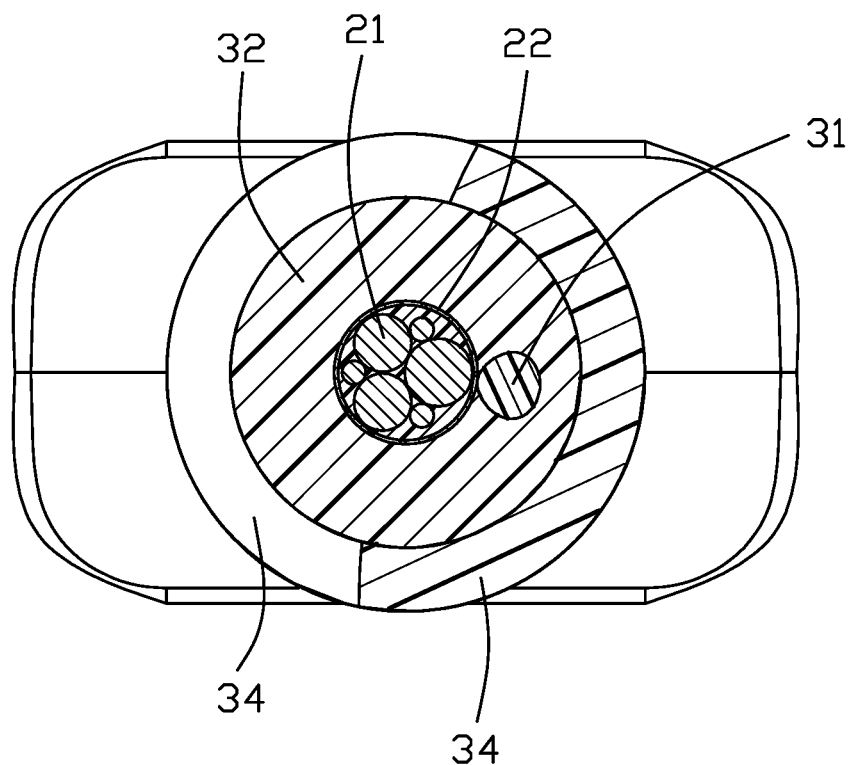
FIG. 7 is a cross-sectional view of the cable connector assembly shown in FIG. 1 along line 7-7.

Referring to FIG. 1, the cable connector assembly 100 in accordance with the present invention comprises a first connector 10, a second connector 50, a cable 20 connecting the first connector 10 and a second connector 50, a seizing structure 30 bundling the cable 20 and an insulative cover 13 covering a connecting part of the first connector 10 and the seizing structure 30.

Referring to FIGS. 1 to 7, the first connector 10 comprises a mating portion 11 and a rear portion 12. The cable 20 comprises a plurality of core wires 21, a shielding layer 22 cladding the core wires 21, and a protective coating 23 covering the shielding layer 22. The seizing structure 30 comprises a metal wire 31 wrapping the cable 20 spirally, a middle insulative layer 32 cladding the metal wire 31, and an outer insulative layer 33 wrapping the middle insulative layer 32 spirally. In the embodiment of the present invention, the protective coating 23 covers a part of the shielding layer 22. The shielding layer 22 comprises an uncovered part exposed out of the protective coating 23 and a covered part covered by the protective coating 23. The uncovered part is near to the first connector 10. The metal wire 31 wraps the uncovered part of the shielding layer 22 spirally. In another embodiment, the protective coating 23 covers the whole shielding layer 22. The metal wire 31 wraps a part of the whole protective coating 23. In another embodiment, the cable 20 comprises a plurality of core wires 21 and a shielding layer 22 cladding the core wires 21. The seizing structure 30 comprises a metal wire 31 wrapping a part of the shielding layer 22 spirally, a middle insulative layer 32 and an outer insulative layer 33 wrapping the middle insulative layer 32 spirally. The middle insulative layer 32 is molded to the metal wire 31 and the whole shielding layer 22 by over-molding process.

The middle insulative layer 32 is molded to the metal wire 31 and the cable 2 wrapped by the metal wire 31 by over-molding process. In the embodiment of the present invention, the middle insulative layer 32 is molded to the metal wire 31, the uncovered part of the shielding layer 22 wrapped by the metal wire and a part of the protective coating 23 near to the uncovered part of shielding layer 22 so as to prevent the metal wire 31 and the shielding layer 22 to separate. In another embodiment, the middle insulative layer 32 is molded to the metal wire 31 and the part of the protective coating 23 wrapped by over-molding process. In another embodiment, the middle insulative layer 32 can be molded over the metal wire 31 and the whole cable 20. In another embodiment, a part of the shielding layer 22 is removed, and the metal wire 31 is directly wrapped upon an inner insulative layer (not labeled) which is originally located between the shielding layer 22 and the core wires 21.

The outer insulative layer 33 wraps the middle insulative layer 32 along the track along which the metal wire 31 wraps the cable 20. The length of which the seizing structure 30 covers the cable 20 is less than the length of the whole cable 20 so as to ensure the flexibility of the cable 20. The outer insulative layer 33 comprises a wrapping section 34 wrapping the middle insulative layer 32 spirally, the holding section 35 seizing the rear portion 12 of the first connector 10, a first strain relief section 36 connecting the holding section 35 and the wrapping section 34, and a second strain relief section 37 connecting the wrapping section 34 and the protective coating 23. The wrapping section 34 is corresponded with the metal wire 31. The track along which the wrapping section 34 wraps the middle insulative layer 32 is the same as the track along which the metal wire 31 wraps the cable 20 so as to prevent the metal wire 31 to be exposed outside and to hurt a user.

The holding section 35 seizes the first connector 10 so as to prevent the out insulative layer 33 and the first connector 10 to separate. The first strain relief section 36 covers a front end of the middle insulative layer 32, a rear end of the first connector 10 and a connecting section between the first connector 10 and the middle insulative layer 32 so as to protect the connecting section. The second strain relief section 36 covers a rear end of the middle insulative layer 32 and a front end of the protective coating 23 so as to avoid the middle insulative layer 32 and the protective coating 23 to separate.

The insulator cover 13 is molded to the holding section 35 and the rear end of the first connector 10 by over-molding process so as to avoid the holding section 35 to turn up.

In using, when packing up the cable connector assembly 100, a part of the cable 20 with the seizing structure 30 is bent firstly, and then wraps the part of the cable 20 with the seizing structure 30 to the other part of the cable 20 without the seizing structure 30. In the present invention, the metal wire 31 restricts the cable 20 not to spread, so that the cable 20 wraps together substantially. Notably, the pitch of the metal wire 31 can be fine enough if the shielding effect is required.

A method of making a cable connector assembly 100, comprising the steps of: providing a first connector 10 and a cable 20 connected with the first connector 10, the first connector 10 having a mating portion 11 and a rear portion 12, the cable 20 having a plurality of core wires 21, a shielding layer 22 cladding the core wires 21 and a protective coating 23 covering the shielding layer 22; stripping a part of the protective coating 23 for exposing a corresponding uncovered part of the shielding layer 22; providing a metal wire 31 and wrapping the metal wire 31 to the corresponding uncovered part of the shielding layer 22 spirally; over molding a middle insulative layer 32 to the metal wire 31 and the corresponding uncovered part of the shielding layer 22, over molding an outer insulative layer 33 to the middle insulative layer 32, and over molding an insulative cover 13 to a connecting part of the first connector 10 and the outer insulative layer 33. The outer insulative layer 33 comprises a wrapping section 34 wrapping the middle insulative layer 32 spirally along a track along which the metal wire 31 wraps, the holding section 35 seizing the rear portion 12 of the first connector 10, a first strain relief section 36 connecting the holding section 35 and the wrapping section 34, and a second strain relief section 37 connecting the wrapping section 34 and the protective coating 23.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A cable connector assembly comprising:
a first connector comprising a mating portion and a rear portion;
a cable connected with the first connector; and
a seizing structure bundling the cable, the seizing structure comprising a metal wire wrapping the cable, a middle insulative layer cladding the metal wire and an outer insulative layer wrapping the middle insulative layer; wherein
the seizing structure covers the cable only for a partial length of the whole cable.

2. The cable connector assembly as claimed in claim 1, wherein the metal wire wraps the cable spirally, the outer insulative layer wraps the middle insulative layer spirally, and the track along which the outer insulative layer wraps the middle insulative layer is the same as the track along which the metal wire wraps the cable.

3. The cable connector assembly as claimed in claim 1, further comprising a second connector connected with the cable, and an insulative cover covering a connecting part of the first connector and the seizing structure.

4. The cable connector assembly as claimed in claim 1, wherein the cable comprises a plurality of core wires and a shielding layer cladding the core wires, the metal wire wrapping a part of the shielding layer spirally, the outer insulative layer wrapping the middle insulative layer spirally, and the middle insulative layer is molded over the metal wire.

5. The cable connector assembly as claimed in claim 1, wherein the middle insulative layer is molded to the metal wire.

6. The cable connector assembly as claimed in claim 5, wherein the outer insulative layer comprises a wrapping section wrapping the middle insulative layer, a holding section seizing the rear portion of the first connector, a first strain relief section connecting the holding section and the wrapping section, and a second strain relief section connecting the wrapping section and the cable.

7. The cable connector assembly as claimed in claim 1, wherein the cable comprises a plurality of core wires, a shielding layer cladding the core wires, and a protective coating covering the shielding layer.

8. The cable connector assembly as claimed in claim 7, wherein the protective coating covers a part of the shielding layer, and the shielding layer comprises an uncovered part exposed out of the protective coating and a covered part covered by the protective coating.

9. The cable connector assembly as claimed in claim 8, wherein the metal wire wraps the uncovered part spirally, the outer insulative layer wraps the middle insulative layer spirally, and the middle insulative layer is molded over the metal wire, the uncovered part, and a part of the protective coating adjacent to the uncovered part.

10. A method of making a cable connector assembly, comprising the steps of:
providing a first connector and a cable connected with the first connector, the first connector having a mating portion and a rear portion, the cable having a plurality of core wires, a shielding layer cladding the core wires, and a protective coating covering the shielding layer;
stripping a part of the protective coating to expose a corresponding uncovered part of the shielding layer;
providing a metal wire and wrapping the metal wire to the corresponding uncovered part of the shielding layer;
over-molding a middle insulative layer to the metal wire and the corresponding uncovered part of the shielding layer; and
over-molding an outer insulative layer to the middle insulative layer.

11. The method as claimed in claim 10, wherein the step of wrapping the metal wire comprises wrapping the metal wire to the corresponding uncovered part of the shielding layer spirally.

12. The method as claimed in claim 11, wherein the step of over-molding the outer insulative layer comprises forming a wrapping section wrapping the middle insulative layer spirally along a track along which the metal wire wraps, a holding section seizing the rear portion of the first connector, a first strain relief section connecting the holding section and the wrapping section, and a second strain relief section connecting the wrapping section and the protective coating.

13. The method as claimed in claim 12, further comprising a step of over-molding an insulative cover to a connecting part of the first connector and the outer insulative layer.

14. A cable connector assembly comprising:
a cable equipped with first and second connectors connected to opposite first and second ends thereof and defining a first section located behind the first connector and a second section located behind the second connector, an inner portion of said cable including a plurality of core wires commonly circumferentially enclosed within an inner insulative layer;
a metallic shielding layer applied upon the second section, and an insulative protective coating applied upon the shielding layer; and
a seizing structure integrally formed upon the first section and including a deformable inner metal wire intimately wrapping the first section in a spiral manner and a middle insulative layer circumferentially enclosing said metal wire and the first section; wherein
the first section is adapted to wrap and grasp the second section in a fixed manner by said seizing structure; and said middle insulative layer is in the form of a tubular structure receiving said first section.

15. The cable connector assembly as claimed in claim 14, wherein the middle insulative layer is diametrically larger than the insulative protective coating.

16. The cable connector assemble as claimed in claim 14, wherein said seizing structure further includes an outer insulative layer circumferentially covering the middle insulative layer spirally in a path along which the metal wire extends.

17. The cable connector assembly as claimed in claim 16, wherein one end of said outer insulative layer is connected to the first connector, and the other end of said outer insulative layer is connected to the insulative protective coating.

* * * * *